United States Patent [19]
Chapin et al.

[11] Patent Number: 5,163,834
[45] Date of Patent: Nov. 17, 1992

[54] HIGH DENSITY CONNECTOR

[75] Inventors: Fletcher W. Chapin, Vestal; David W. Dranchak, Endwell; David E. Engle, Vestal; Richard R. Hall, Endwell; Thomas G. Macek, Endicott, all of N.Y.

[73] Assignee: International Business Machines Corporation, Armonk, N.Y.

[21] Appl. No.: 734,419

[22] Filed: Jul. 23, 1991

Related U.S. Application Data

[62] Division of Ser. No. 628,057, Dec. 17, 1990, Pat. No. 5,061,192.

[51] Int. Cl.⁵ .............................. H01R 9/09
[52] U.S. Cl. ......................... 439/66; 439/86; 439/591
[58] Field of Search ............... 439/66, 86, 87, 91, 439/591

[56] References Cited

U.S. PATENT DOCUMENTS

| | | |
|---|---|---|
| 3,541,222 | 11/1970 | Parks et al. |
| 3,634,807 | 1/1972 | Grobe et al. |
| 3,680,037 | 7/1972 | Nellis et al. |
| 3,862,790 | 1/1975 | Davies et al. |
| 3,960,423 | 6/1976 | Weisenberger ............ 439/66 |
| 3,971,610 | 7/1976 | Buchoff et al. |
| 4,064,623 | 12/1977 | Moore ....................... 439/86 |
| 4,408,814 | 10/1983 | Takashi et al. ............. 439/66 |
| 4,998,885 | 3/1991 | Beaman. |
| 5,061,192 | 10/1991 | Chapin et al. |

Primary Examiner—Paula A. Bradley
Attorney, Agent, or Firm—Lawrence R. Fraley

[57] ABSTRACT

An electrical connector for interconnecting a pair of circuit members (e.g., circuit module and printed circuit board) which assures highly reliable yet separable connections for these members. The connector includes an electrically insulative (e.g., plastic) frame which defines an internal opening therein. Bridging this opening are a plurality of individual, resilient contact members which are maintained in a suspended and spaced orientation within the opening by a plurality of pairs of elongated insulative members (e.g., polymer rods). Each of the contacts is thus readily removable from the connector's frame to thus facilitate repair and/or replacement. As described, the connector is capable of providing wiping connections, thus assuring removal of debris or other contaminants from the respective conductive pads for each circuit member. In another embodiment, the connector includes a common carrier (e.g., plastic) having therein a plurality of cylindrical shaped resilient contact members (e.g., silicone) which further include a quantity of conductive (e.g., metallic) particles therein. To assure a wiping form of engagement with the respective conductive pads, each of the terminal ends of each contact member preferably includes a plurality of dendritic, interdigitated members thereon.

13 Claims, 5 Drawing Sheets

HIGH DENSITY CONNECTOR

This is a divisional of copending application(s) Ser. No. 07/628,057 filed on Dec. 17, 1990, now U.S. Pat. No. 5,061,192.

TECHNICAL FIELD

The invention relates to the field of electrical connectors and particularly to electrical connectors for interconnecting at least two electrical circuit members such as printed circuit boards, circuit modules or the like. Even more particularly, the invention relates to connectors of this type which may be used in the information handling system (computer) environment.

CROSS-REFERENCE TO CO-PENDING APPLICATIONS

In Ser. No. 07/427,548, entitled, "Elastomeric Area Array Interposer", filed Oct. 27, 1989, there is defined an elastomeric interposer member for interconnecting circuit members wherein differential stress is reduced in the elastomer body, thereby assuring greater reliability of connections. Conductive wiring is used in the elastomeric body to provide the conductive means. Ser. No. 07/427,548 is now U.S. Pat. No. 4,998,885.

In Ser.No. 07/415,435, entitled, "Separable Electrical Connection Technology", filed Sep. 28, 1989, now abandoned, there is defined a type of electrical connection wherein a plurality of interdigitated members (e.g., of the dendritic variety) are utilized. The materials for such members may be comprised of palladium, platinum, rhodium, ruthenium, osmium and tungsten. Use of dendritic, interdigitated members of this type is possible in one embodiment of the present invention.

Both of the above applications are assigned to the same assignee as the present invention. The disclosures of these applications are incorporated herein by reference.

BACKGROUND

The current trend in connector design for those connectors utilized in the computer field is to provide both high density and high reliability connections between various circuit devices which form important parts of the computer. High reliability for such connections is essential due to potential end product failure, should vital misconnections of these devices occur. Further, to assure effective repair, upgrade, and/or replacement of various components of the system (i.e., connectors, cards, chips, boards, modules, etc.), it is also highly desired that such connections be separable and reconnectable in the field within the final product, as well as tolerant of dust and fibrous debris. Such a capability is also desirable during the manufacturing process for such products, e.g., to facilitate testing.

One prior technique for providing various interconnections is referred to as a wire bond technique, which involves the mechanical and thermal compression of a soft metal wire, e.g., gold, from one circuit to another. Such bonding, however, does not lend itself readily to high density connections because of possible wire breakage and accompanying mechanical difficulty in wire handling. Another technique involves strategic placement of solder balls or the like between respective circuit elements, e.g., pads, and reflowing the solder to effect interconnection. While this technique has proven extremely successful in providing high density interconnections for various structures, this technique does not allow facile separation and subsequent reconnection. In yet another technique, an elastomer has been used which included therein a plurality of conductive paths, e.g., small diameter wires or columns of conductive material, to provide the necessary interconnections. Known techniques using such material typically possess the following deficiencies: (1) high force necessary per contact which can be inherent in a particular design and exacerbated due to non-planarity of the mating surfaces; (2) relatively high electrical resistance through the interconnection between the associated circuit elements, e.g., pads; (3) sensitivity to dust, debris and other environmental elements which could readily adversely affect a sound connection; and (4) limited density, e.g., due to physical limitations of particular connector designs. Such prior art elastomeric structures also typically fail to provide effective wiping connection, which form of connection is highly desirable in many high density interconnection schemes.

Attention is directed to U.S. Pat. Nos. 3,796,986, 3,960,424, 4,295,700, 4,636,018, 4,688,151, 4,738,637, 4,793,814, 4,912,772 and 4,943,242 for various techniques for providing electrical interconnections for a variety of electrical circuit members. As understood from a reading of these patents, the techniques as described therein include many of the aforedefined disadvantages, e.g., non-repeatability, potential misalignment, low density, etc. as well as others, e.g., relatively complex design, costly to manufacture, etc.

It is believed that a high density electrical connector capable of providing effective, reliable connections (including providing a wiping type of connection), wherein such connections are repeatable (such that connection and reconnection can readily occur), and which provides the other advantageous features discernible from the following description would constitute a significant advancement in the art.

DISCLOSURE OF THE INVENTION

It is, therefore, a primary object of the present invention to enhance the electrical connector art.

It is another object of the invention to provide an electrical connector capable of providing high density interconnections of a highly reliable and improved nature, which connections can be readily separated and repeated (if desired).

It is yet another object of the invention to provide such a connector which is relatively inexpensive to manufacture and also of a relatively simplistic design.

In accordance with one aspect of the invention, there is provided a connector for electrically interconnecting a pair of electrical circuit members, the connector comprising an electrically insulative frame for being positioned between the circuit members, and at least one elongated, resilient contact member spacedly positioned within the frame and including first and second arrays of contact segments at opposing ends thereof, each of these segments adapted for engaging circuitry (e.g., pads) on the respective circuit members. The connector further includes at least one pair of elongated, electrically insulative members which are also located within the frame member such that the pair is designed for engaging the elongated contact member at opposing ends thereof so as to position the contact member within the frame.

In accordance with another aspect of the invention, there is provided a connector for electrically interconnecting a pair of electrical circuit members wherein the connector comprises an electrically insulative carrier member designed for being positioned between the circuit members and a plurality of individual resilient contact members spacedly located within the carrier and each including a quantity of electrically insulative material (e.g., elastomeric) having therein a quantity of conductive (e.g., metallic) particles therein. The contact members include opposed end contacting portions which are each designed for engaging the circuitry (e.g., pads) on the respective circuit members.

Both of the above embodiments of the invention enable compression thereof by the respective circuit members to provide the desired interconnections.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
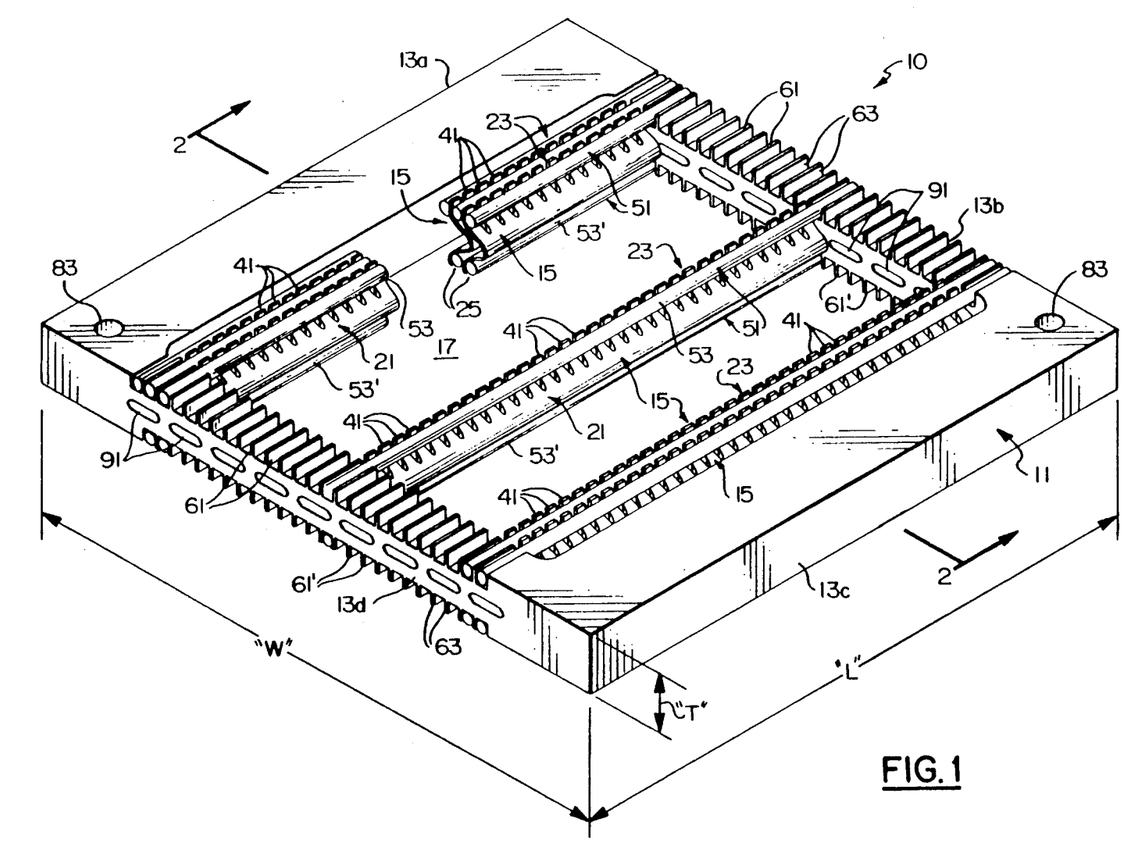
FIG. 1 is a prospective view of an electrical connector in accordance with one embodiment of the invention.

In FIG. 1, there is shown a connector 10 in accordance with one embodiment of the invention. Connector 10 comprises a frame member 11 of electrically insulative, e.g., plastic, material and, as illustrated, is preferably of substantially rectangular configuration having a plurality, e.g., four, of side walls 13a, 13b, 13c and 13d. In one example of the invention, frame 11 may possess a width (dimension "W") of about 5.0 inches and a corresponding length (dimension "L") of about 5.0 inches. This frame may also possess a thickness (dimension "T") of only about 0.30 inches. As stated, the preferred material for frame 11 is plastic, with suitable examples of such material being phenolic, polyester, and Ryton (a trademark of Phillips Petroleum Company).

Frame member 11 is adapted for being positioned between a pair of electrical circuit members to thus form part of connector 10, which connector serves to interconnect said circuit members. Examples of suitable circuit members for being interconnected by connector 10 include printed circuit boards, circuit modules, etc. By the term printed circuit board is meant to include a multilayered circuit structure including therein one or more conductive (e.g., signal, power and/or ground) layers therein. Such printed circuit boards, also known as printed wiring boards, are well known in the art and further description is not believed necessary. By the term circuit module is meant to include a substrate or the like member having various electricla components (e.g., semiconductor chips, conductive circuitry, conductive pins, etc.) which may form part thereof. Such modules are mentioned in U.S. Pat. Nos. 4,688,151 and 4,912,772 and further description is thus not believed necessary. The disclosures of these patents are thus incorporated herein by reference.

Connector 10 further includes at least one (and preferably a plurality) elongated, resilient contact member 15 positioned within frame 11. Although five such contact members are illustrated in FIG. 1 (and FIGS. 2 and 3), it is understood that several additional such contact members may be utilized (and are preferably so) as part of the invention. In one embodiment of the invention, for example, a total of about 140 such members may be utilized. Each contact member 15 is located so as to substantially occupy an internal, rectangular opening 17 defined by the frame side walls 13a–13d. It is understood, as shown in FIG. 1, that these contacts substantially abut the internal surfaces of opposing side walls 13b and 13d. By the term substantially abut is meant that slight engagement by each contact member at one or both opposite ends thereof with a respective, adjacent frame side wall may occur. These contact members are thus arranged in substantially parallel, spaced orientation within central opening 17. Significantly, these contact members do not become located on or inserted within the frame's side walls but, as shown, remain substantially therebetween. Such placement is deemed significant because it facilitates subsequent operation of these contact members, when engaged by the respective circuit members being interconnected. Such placement facilitates compression of these resilient contact members, while also enabling ready removal thereof from within frame 11, e.g., in repair and/or replacement situations.

Figure 4:
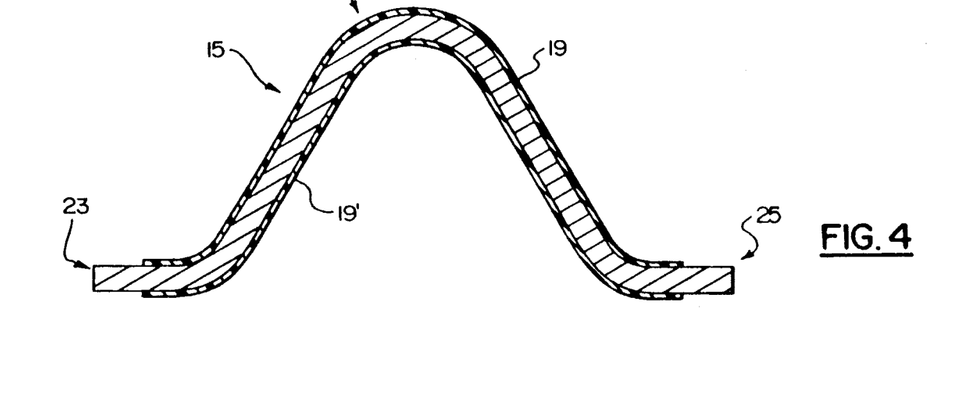
FIG. 4 is a much enlarged, sectional view of a resilient contact member in accordance with one embodiment of the invention, said contact member of the type preferably utilized in the embodiment depicted in FIG. 1.
Figures 5, 6:
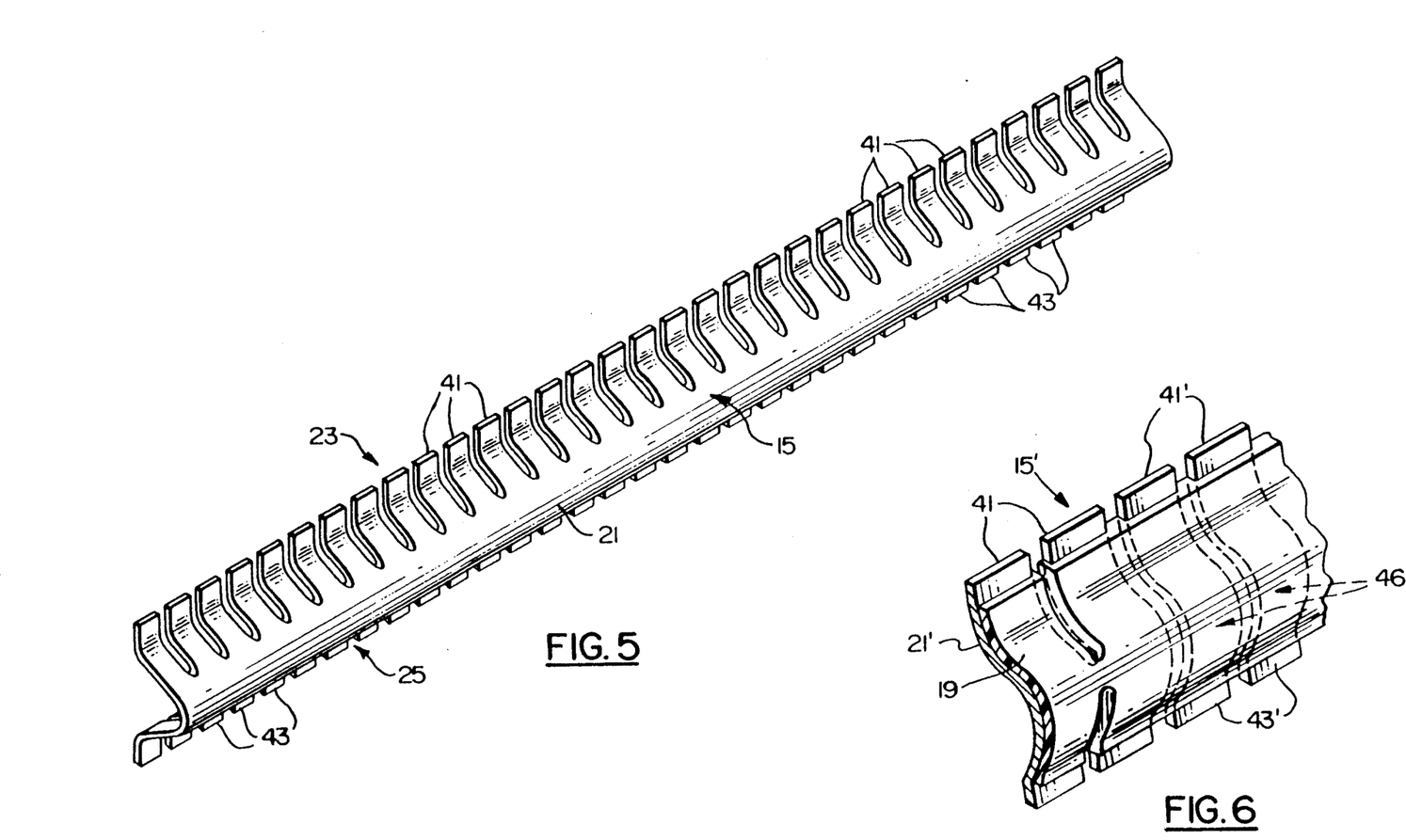
FIG. 5 illustrates the contact member of FIG. 4, but excluding a layer (or layers) of dielectric material thereon.
FIG. 6 is a partial perspective view of a contact member in accordance with an alternative embodiment of the invention, said contact member capable of being utilized in the connector illustrated in FIG. 1.

Each contact member 15 is preferably copper or similar metallic material including, e.g., phosphor bronze, beryllium-copper, etc. Preferably, each is also plated with corrosion-resistant, sound conducting metallic material such as nickel, gold, silver, palladium, etc. To further assure prevention of accidental shorting with adjacent such members, each contact member may include a relatively thin layer 19 of dielectric material over a major portion thereof. A more detailed illustration of a contact member 15, taken in section, is seen in FIG. 4. As shown therein, two such layers, 19 and 19' may be used. Each layer, as stated, is of a dielectric material, a preferred example being polyimide. As also shown in FIG. 4, spring contact member 15 includes a substantially curved, central portion 21 with first and second projecting end portions 23 and 25 extending in a substantially opposite manner from the central curved portion 21. Each opposing end 23 and 25 is designed for electrically contacting respective circuit elements (e.g., flat conductive pads 31 located on the respective surfaces of the circuit members 33, 35 in FIGS. 2 and 3). As stated, these circuit members may be printed circuit boards (e.g., 35) having such flat conductive members (e.g., copper terminals) located on an upper surface thereof. These circuit members may also comprise the aforedefined circuit module 33 including a substrate 37 having a plurality of semiconductor elements 39 thereon and corresponding flat conductive pads (e.g., thin copper elements) 31 located on a bottom, external surface. The defined conductive pads 31 are, understandably, electrically coupled to corresponding circuitry which forms part of the respective electrical circuit members. These pads may provide signal, power or ground connections, depending on the operational requirements of the respective circuit member. In the embodiment of the invention as depicted in FIG. 1, for example, the illustrated, integral contact members as shown therein preferably provide power connections between the respective circuit devices. This is not meant to limit the invention, however, in that these contact members may be segmented, such as illustrated in FIG. 6, to provide instead a plurality of signal connections of individual nature for each such contact member. The integral structure for contact members 15 depicted in FIG. 1 is similar to that shown in FIG. 5 (but without dielectric material thereon) and thus is capable of such individual plurality of separate connections. The description of the embodiment in FIG. 6, representing yet another version, will be provided below.

Each contact member, as shown in FIG. 1, includes an array of contact segments 41 along the first opposing end portion 23 and a similar array of such contact segments 43 (shown in FIG. 5) fitted on or, preferably, forming part of, the second opposing end 25 of each such contact member 15. The array of first segments 41, as shown in FIGS. 2 and 3, is adapted for engaging corresponding individual flat conductive pads 31 which are located on the external surface of circuit member 33, while the corresponding array of contact segments 43 are designed for engaging and electrically contacting the respective conductive pads 31 located on the upper surface of circuit member 35.

In the embodiment of FIG. 6, there is shown an elongated contact member 15' in accordance with an alternative embodiment of the invention. Contact 15' preferably possesses similar dimensions to the metallic, integral resilient contact member 15 in FIG. 5 in terms of overall length and height. However, in the embodiment of FIG. 6, contact member 15' is shown as including at least one layer 19 of dielectric (e.g., polyimide) thereon and extending substantially the entire width of the member. In such an arrangement, it is possible to segment the respective contact segments into individual contact parts 46, each comprised of opposing contact segments 41' and 43'. Alternatively, it is also possible to incorporate as part of this member one or more integral metallic portions 21' which, like contact 21 in FIG. 5, is capable of providing a common connection to two or more opposing pairs of conductive pads 31. Thus, in the embodiment of FIG. 6, it is possible to combine signal and power functions utilizing a singular contact member. Understandably, dielectric material 19 is of sufficient thickness to maintain the individual contacting sections in the desired spaced orientation so as to assume an overall, elongated configuration such as shown in FIG. 5. In such an embodiment, the conductive metallic members 21 possess a thickness, preferably, of only about 0.003 inch to about 0.008 inch, while the corresponding dielectric (e.g., polyimide) possesses a thickness of about 0.0003 to about 0.010 inch. Understandably, it is also readily possible to utilize a second layer of dielectric material in the embodiment of FIG. 6 on the opposite side of the conductive metallic member. If so utilized, this layer of material would preferably possess a thickness of about 0.0003 inch to about 0.003 inch.

The signal characteristics, such as impedance, of these individual contact parts (46) used for signal connections can be controlled and improved by adding another layer of metal (i.e., copper) on either one or both of the dielectric layers by lamination, sputtering, etc. The additional layer(s) of metal would be connected to one or more connections of the same potential (voltage or ground) through conductive openings (e.g., plated through holes) located within the dielectric. The signal characteristics of individual contact parts (46) can be further enhanced by judicious placement of the contact members (15 and 15'). For example, an array of signal and power connections may be formed by alternating rows of contact members 15 and 15', the signal connection performance being improved since the signal members have a parallel pair of ground or power connections surrounding each. This substantially provides a triplate transmission line structure for the signal connections which will give improved impedance control and reduced coupled noise.

Figure 2:
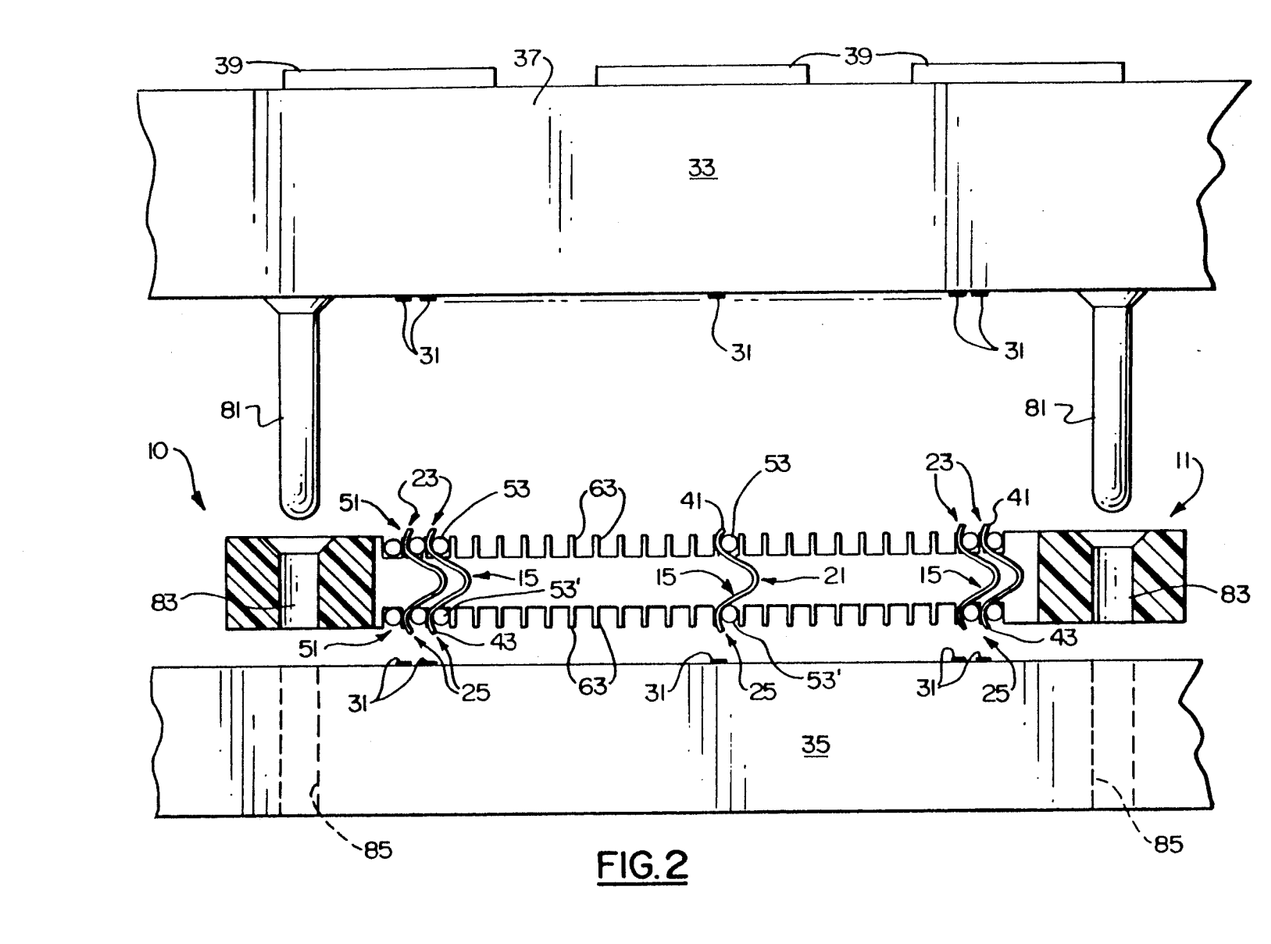
FIG. 2 illustrates the connector of FIG. 1 as being located between and in alignment with a pair of circuit members for eventually providing interconnection therebetween.
Figure 3:
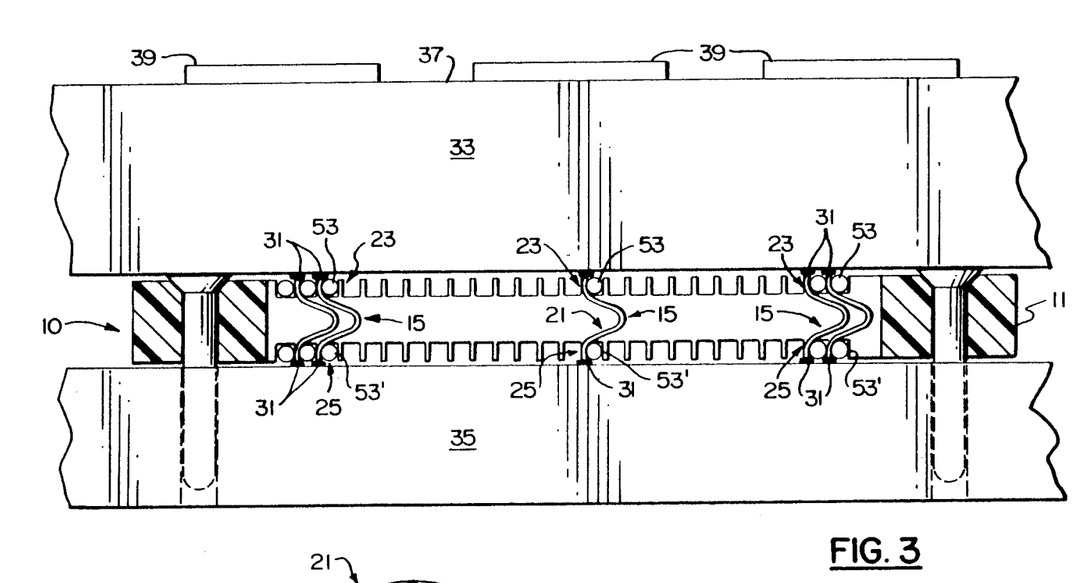
FIG. 3 represents the circuit members and connector depicted in FIG. 2 while in a closed, interconnected position.

Connector 10, as shown in FIGS. 1-3, further includes a plurality of pairs 51 of elongated, electrically insulative members 53 and 53' which are located within frame member 11 (within opposing sides 13b and 13d) and are specifically designed for holding the respective resilient contact members in the suspended position between opposing sides 13b and 13d. Specifically, each pair 51 of two such members 53 and 53' is particularly designed for engaging the respective opposing end portions 23 and 25 respectively, of each contact 15. Each pair thus serve to position this contact in the substantially upright configuration depicted in FIGS. 2 and 3.

More specifically, and as best seen in FIGS. 2 and 3, each opposing end (23, 25) is engaged on opposite sides thereof. The aforedefined first pair 51 engages the contact ends along a first side (e.g., on the right side of the vertically oriented contact member in FIGS. 2 and 3) while a second pair 51 engages the contact from the other side (the left in FIGS. 2 and 3). In effect, two pairs 51 of insulative members serve to compress each contact member as a result of such engagement, thereby retaining the contact in the desired upright orientation.

Each insulative member 53 and 53' preferably comprises a cylindrical rod of polymer material, suitable examples of such material being Ryton and nylon. Other configurations, including octagonal, hexagonal, etc. may be used for members 53 and 53'. The ends of each rod are designed for being frictionally positioned within a respective groove 61 formed within the respective sides 13b and 13d. As shown in FIG. 1, the upper rods 53 of each pair are frictionally inserted within corresponding upper grooves 61 located within the upper surfaces of sides 13b and 13d. The corresponding lower rods 53' of each pair are located within corresponding lower grooves 61' located within the lower surface of each respective side 13b and 13d. In one example of the invention, each polymer rod may possess an outer diameter of about 0.025 inch, with each corresponding groove (61 or 61') possessing a width of about 0.024 inch, thus assuring a substantially frictional engagement between these members. Grooves 61 and 61' are each preferably defined by a pair of adjacent upstanding fins 63 or the like, arranged in parallel to each other.

Frame 13, as shown, is of one-piece construction. However, it is possible to make this of two-piece construction (e.g., upper and lower halves), each piece including rods (53 or 53') formed as integral parts thereof (e.g., molded as part of each piece). Such a construction may serve to enhance manufacturability.

The suspended positioning orientation of each curvilinear contact spring 15 can best be seen in the unactivated position for connector 10 as depicted in FIG. 2. Therein, each spring is oriented in an upright manner such that the central curved portion 21 extends in a lateral direction (to the right in FIG. 2). Significantly, each of these contact springs as shown in FIG. 2 is illustrated in its expanded configuration. The opposing ends 23 and 25 exert minimal expansion (outward) force against the polymer rods while in this position. Thus, the frictional force of these rods must thus be sufficient to hold the weight of the rods and contacts in place.

In FIG. 2, connector 10 is shown prior to interconnecting the respective conductive pads 31 on the two circuit members (circuit module 33 and printed circuit board 35). In this unactivated arrangement, the upper end portions 23 of each contact extend slightly above the upper surface of the frame member 11 while the opposing extending ends 25 extend below the lower, planar surface of the frame. In one example, each of these end portions may extend a distance of about 0.015 inch from the respective planar surface.

In FIG. 3, the opposing circuit members 33 and 35 have been moved relative to each other so as to compress the contact members 15 within frame 11. That is, each of the arrays of contact segments (41 and 43) for each contact member engages a respective one of the conductive pads 31 of the respective circuit member to provide electrical interconnection between such pads in the desired manner. Each extending end 23 and 25 is thus compressed such that the terminal end portions thereof lie substantially parallel to the upper and lower surfaces of frame 11. Such compression results in slight displacement of the curvilinear central portions 21 of each contact member to cause further outward (to the right in FIG. 3) bowing thereof. Each contact member, however, maintains a spaced distance from the respective adjacent contact member so as not to electrically contact this member and thus become electrically shorted thereto. As stated, further assurance against this undesirable occurrence is provided by the utilization of a layer of dielectric material on at least one external surface of each contact member. Significantly, the compression of each contact member causes the outwardly extending end portions of each contact member to engage the respective conductive pad 31 in a wiping manner. This is highly desired in high density connections of the type defined herein, e.g., to penetrate films, remove debris and other contaminants which may affect these points of connection.

Alignment of the two circuit members 33 and 35 relative to interim connector 10 may be provided utilizing a pair of protruding pins 81 which extend from one of the circuit members (e.g., module 33), these pins being aligned with and positioned within corresponding openings 83 within frame 11 and openings 85 (shown hidden) within the other of these circuit members. It is understood that other means of alignment are readily possible, including the provision of pins extending from opposing surfaces (upper and lower) of frame 11 for insertion within corresponding openings within the respective circuit members. To adjust for tolerancing, one of such openings within connector 10 may be of elongated configuration, as illustrated in FIG. 1.

To enable cooling of the metallic contact members 15 within frame 11, including during operation of connector 10, a plurality of slots 91 (not shown in FIGS. 2 and 3) may be provided within at least one of the side walls of the frame. Preferably, these slots are provided in opposing sides 13b and 13d to enable fluid coolant (liquid or gas) to readily pass through the parallel aligned and closely spaced contact members. A preferred coolant is air. It is also possible to use nitrogen and oil for this purpose. It would be highly desirable to provide a sealed system through the use of bladders, tubes, etc. if liquids are to be used as the coolant. Should connector 10 be utilized solely as a power connector, temperatures of about one hundred degrees Celsius (C.) may be reached during connector operation. Through the effective utilization of coolant fluids, these temperatures may be reduced by approximately fifty percent, thus enhancing the operation of the invention.

Figure 7:
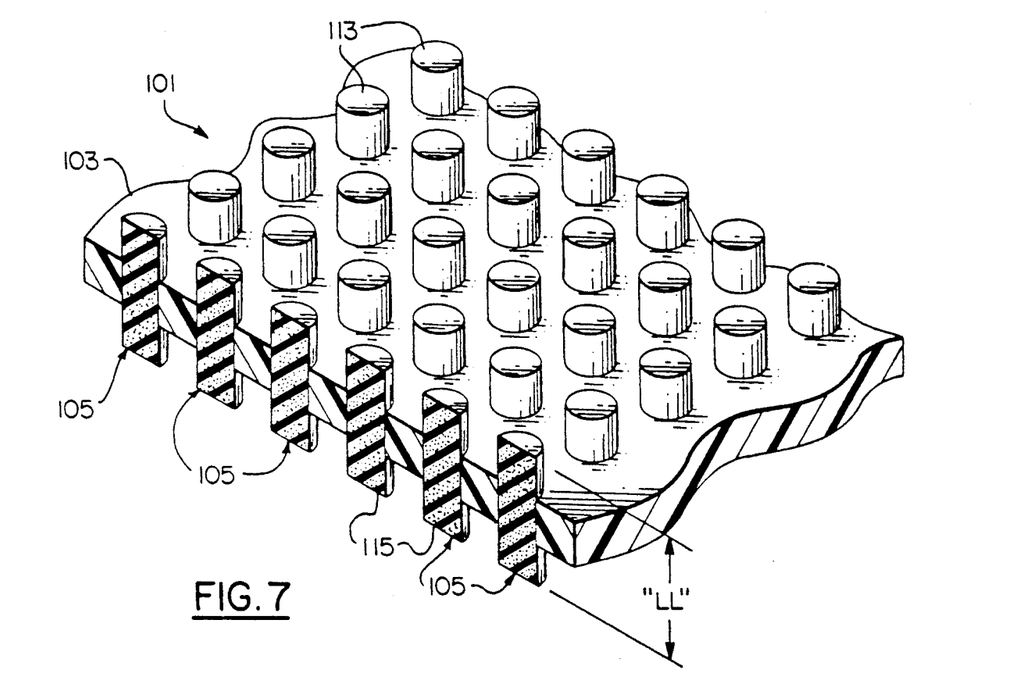
FIG. 7 illustrates, in a partial prospective view, an electrical connector in accordance with another embodiment of the invention.

In FIG. 7, there is shown a connector 101 for electrically interconnecting a pair of electrical circuit members such as circuit members 33 and 35, in accordance with another embodiment of the invention. Connector 101, as shown in FIG. 7, includes a common, electrically insulative carrier member 103 having therein a plurality of individual resilient contact members 105. Connector 101, as in the case of connector 10, is designed for being positioned between the opposing circuit members and for being aligned therewith. Such alignment may be possible by placement of the common carrier 103 within a frame 111 (FIG. 8), said frame 111 also including openings (not shown) such as openings 83 in FIG. 2. Alternatively, connector 101 may be used without such a supporting and retaining frame and aligned by alternative means such that each of the extending end sections 113 and 115 of each contact member positively engages the corresponding conductor pad 31 of these circuit members. Each resilient contact member 105 is thus compressed during such engagement to form the appropriate interconnection between corresponding pairs of such conductive pads 31.

Each contact member is preferably of an elastomer material, with a suitable example being a low compression set silicone. The corresponding carrier member is preferably plastic, with suitable examples being Ryton, and liquid crystal polymer. To render the respective contact members electrically conductive, each of these elastomer members includes a quantity of conductive particles therein. Such particles are preferably metallic, with preferred materials being gold (or gold plated) and silver (or silver plated). These particles are preferably flakes or spherical elements. In one example of the invention, each substantially cylindrical shaped contact member 105 may possess a diameter of about 0.040 inch and a corresponding length (dimension "LL" in FIG. 7) of about 0.100 inch. The corresponding thickness for carrier 103 is about 0.020 inch.

In an alternative embodiment, carrier 103 can be metallic (e.g., aluminum) so as to be electrically connectable to selected ones of the contacts 105 (e.g., to reference such contacts to ground) but isolated from remaining ones of such contacts (e.g., by provision of a suitable dielectric coating at the locations of engagement between such remaining contacts and said carrier). It is also preferred that the maximum distance that each resilient contact extends above (or below) the respective carrier surface be no greater than the diameter of such contact, assuming a cylindrical configuration. Such will prevent contact buckling during engagement. It is even further preferred that the amount of particles in each contact comprise about 45 percent by volume of each contact. It is, of course, understood from the foregoing that each contact is readily capable of functioning as a signal, power or ground contact.

Figure 8:
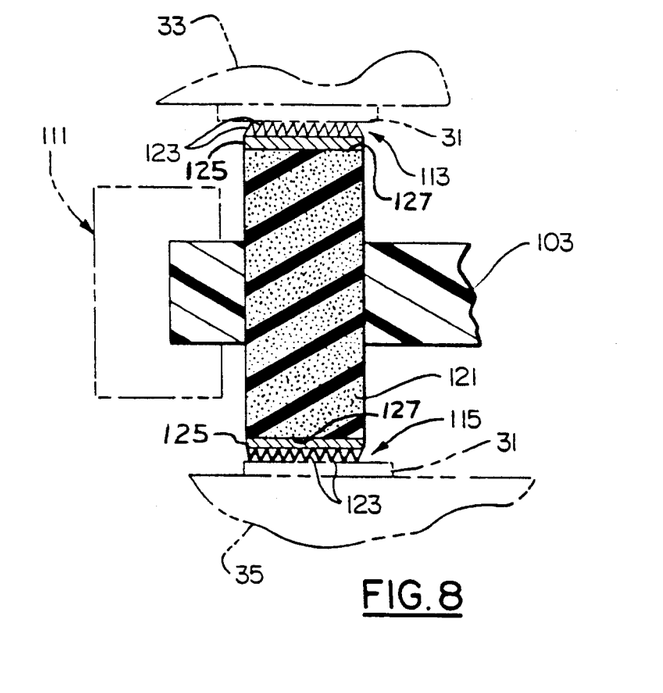
FIG. 8 represents a side elevational view, in section and on a much enlarged scale over the view of FIG. 7, of one of the resilient contact members which may form part of the connector of FIG. 7.

It is understood that in the embodiment of FIGS. 7 and 8, the terminal end portions of each contact member are designed for physically engaging the respective conductive pad or the like (31 in FIG. 8). In FIG. 8, the contact member is shown on a much enlarged scale over that of FIG. 7 such that the respective conductive particles 121 may be seen therein. To further enhance electrical connection with the respective flat conductive pads 31, the terminal ends of each contact member each preferably include a plurality of interdigitated conductive elements 123, which, as stated, may be of the type described in co-pending application Ser. No. 07/415,435, filed Sep. 28, 1989. The disclosure of this application is thus incorporated herein by reference. As seen in FIG. 8, elements 123 are located on metallic layers 125, which layers 125 in turn are located on respective end surfaces 127 of the contact's elastomeric material. During engagement with the respective conductive pads, and the resulting compression of the elastomeric body portion of each contact member, the respective plurality of conductive elements thus form a wiping type engagement with the respective conductive pad. The advantages of such an engagement have been described above. It is further understood that additional members, including, for example, elastomeric non-conductive members, may be incorporated within carrier 103. Such members may, for example, function as spacers to further assist positioning of the invention between the circuit members, and may also be of similar or different (e.g., of lesser overall height) configuration than contact members 105.

Thus there has been shown and described an electrical connector for providing highly dense interconnections between corresponding pluralities of conductive elements on opposing pairs of circuit members. Such connections are obtainable in a facile manner using the invention, which is of relatively simple construction and thus relatively inexpensive to manufacture. It is understood from the foregoing that the described connections are readily separable such that the connector can be removed and repositioned if necessary. Such capability enables testing of the respective circuits on the described circuit members, as well as substitution of other such members, if desired, in an overall connector scheme.

While there have been shown and described what are at present considered the preferred embodiments of the invention, it will be obvious to those skilled in the art that various changes and modifications may be made therein without departing from the scope of the invention as defined by the appended claims.

What is claimed is:

1. A connector for electrically interconnecting first and second electrical circuit members, said connector comprising:
    an electrically insulative carrier member adapted for being positioned between said first and second circuit members; and
    a plurality of individual, resilient contact members spacedly positioned within said carrier member, each of said contact members including a quantity of electrically insulative material having a quantity of conductive particles located therein, each of said contact members including a pair of opposed end portions, each of said end portions adapted for engaging circuitry on a respective one of said circuit members and including a metallic layer located on said electrically insulative material and having a plurality of dendritic conductive elements located thereon.

2. The connector according to claim 1 wherein said carrier is plastic.

3. The connector according to claim 1 wherein said conductive particles are metallic.

4. The connector according to claim 1 further including a frame member, said carrier member being positioned within said frame member.

5. The connector according to claim 1 wherein each of said contact members is adapted for being compressed by said first and second electrical circuit members during said engaging of said end portions of said contact members with said circuitry on said circuit members.

6. The connector according to claim 1 wherein said resilient contact members provide a wiping type of electrical connection with said circuitry on said circuit members.

7. The connector according to claim 1 wherein said conductive particles are flakes.

8. The connector according to claim 1 wherein said conductive particles are spherical elements.

9. The connector according to claim 1 wherein said end portions of each of said resilient contact members extend above or below said insulative carrier members a distance no greater than the diameter of said contact members to prevent buckling of said contact members during engagement with said circuit members.

10. The connector according to claim 1 wherein said insulative material for each of said resilient contact members is an elastomer.

11. The connector according to claim 10 wherein said elastomer is silicone.

12. The connector according to claim 1 wherein said conductive particles are of a different material than the material of said dendritic conductive elements.

13. The connector according to claim 12 wherein the material of said conductive particles is selected from the group consisting essentially of gold and silver and the material of said denntritic conductive elements is selected from the group consisting essentially of palladium, platinum, rhodium, ruthenium, osmium and tungsten.

* * * * *